(12) United States Patent
Lee et al.

(10) Patent No.: US 8,503,884 B2
(45) Date of Patent: Aug. 6, 2013

(54) BIDIRECTIONAL OPTICAL TRANSCEIVER

(75) Inventors: Jong-jin Lee, Gwangju-si (KR);
Hyun-seo Kang, Gwangju-si (KR);
Jai-sang Koh, Gwangju-si (KR)

(73) Assignee: Electronics and Telecommunications Research Institute (KR)

( * ) Notice: Subject to any disclaimer, the term of this patent is extended or adjusted under 35 U.S.C. 154(b) by 569 days.

(21) Appl. No.: 12/552,275

(22) Filed: Sep. 1, 2009

(65) Prior Publication Data
US 2010/0086310 A1    Apr. 8, 2010

(30) Foreign Application Priority Data

Oct. 2, 2008 (KR) .................. 10-2008-0096979

(51) Int. Cl.
*G02B 6/42* (2006.01)
*H04B 10/00* (2013.01)

(52) U.S. Cl.
USPC ............. 398/138; 398/135; 398/136; 385/92; 385/88; 385/93; 385/14; 385/89

(58) Field of Classification Search
USPC .................................. 398/135, 136
See application file for complete search history.

(56) References Cited

U.S. PATENT DOCUMENTS

| 7,093,988 | B2 | 8/2006 | Tsumori |
| 7,142,740 | B2 | 11/2006 | Lee et al. |
| 7,184,453 | B2 * | 2/2007 | Takemori ................. 372/50.21 |
| 7,203,391 | B2 | 4/2007 | Uekawa et al. |
| 2001/0043387 | A1 * | 11/2001 | Lawrence et al. ............. 359/333 |
| 2003/0161593 | A1 * | 8/2003 | Stackhouse ..................... 385/92 |
| 2005/0117201 | A1 * | 6/2005 | Yamane et al. ................ 359/333 |
| 2007/0176298 | A1 * | 8/2007 | Osone et al. .................. 257/777 |

FOREIGN PATENT DOCUMENTS

| KR | 10-2003-0089105 A | 11/2003 |
| KR | 1020030090816 A | 12/2003 |
| KR | 102006000507 A1 * | 1/2006 |
| KR | 1020060005078 A | 1/2006 |
| KR | 10-2006-0075987 A | 7/2006 |

OTHER PUBLICATIONS

PARK English translation.*

* cited by examiner

*Primary Examiner* — Shi K Li
*Assistant Examiner* — Oommen Jacob
(74) *Attorney, Agent, or Firm* — Blakely Sokoloff Taylor & Zafman

(57) ABSTRACT

A bidirectional optical transceiver is disclosed. In the bidirectional optical transceiver, by implementing, as a stacked structure, an optical bench in which an optical system and an optical-transmitting module are installed and a multi-layer substrate with good thermal, electrical and high-resistance characteristics in which an optical-receiving module and a driving circuit for driving the optical-transmitting module are installed, thermal, electrical or optical crosstalk is prevented, high-speed transmission of transmission signals is possible through high-speed modulation thereof, and miniaturization is achieved.

10 Claims, 3 Drawing Sheets

BIDIRECTIONAL OPTICAL TRANSCEIVER

CROSS-REFERENCE TO RELATED APPLICATION

This application claims the benefit under 35 U.S.C. §119(a) of Korean Patent Application No. 10-2008-96979, filed on Oct. 2, 2008, the disclosure of which is incorporated by reference in its entirety for all purposes.

BACKGROUND

1. Field

The following description relates to a bidirectional optical transceiver, and more particularly, to a technology for preventing thermal, electrical or optical crosstalk in a bidirectional optical transceiver which provides reception and transmission using one optical line.

2. Description of the Related Art

In a passive optical network, such as a Gigabit PON (GPON), an Ethernet PON (EPON), a Wavelength Division multiplexing PON (WDPON) and so on, an Optical Network Unit (ONU) and Optical Line Terminal (OLT) each includes an optical-transmitting module and an optical-receiving module. A bidirectional optical transceiver is an apparatus in which an optical-transmitting module and an optical-receiving module are packaged into one body to perform transmission and reception through one optical line.

FIG. 1 illustrates a conventional TO-can type bidirectional optical transceiver. As illustrated in FIG. 1, in a bidirectional optical transceiver, an optical-transmitting module 10, an optical-receiving module 20 and an optical line 30 are arranged in a T-shaped form, and an optical system 40 is located in the center of a housing 50 which has a O-shaped form.

The optical-transmitting module 10 includes a laser diode 11 and a monitoring diode 12, the optical-receiving module 20 includes a photodiode 21 and a pre-amplifier 22, the optical line 30 may be an optical fiber suitable for receiving/transmitting optical signals, and the optical system 40 includes an optical filter 41 inclined at 45 degrees, a first lens 42, a second lens 43 and a third lens 44.

A beam transmitted from the laser diode 11 of the optical-transmitting module 10 is converted into collimated light through the first lens 42, is input to and passes through the optical filter 41, and is directed towards the second lens 43. The second lens 43 focuses the collimated light which is penetrated by the optical filter 41 and outputs the focused beam to the optical line 30. The beam is externally transmitted through the optical line 30, so that an optical signal is transmitted.

Meanwhile, a beam received through the optical line 30 is converted into collimated light by the second lens 43 and input to the optical filter 41, and then the collimated light is reflected by the optical filter 41 towards the third lens 44. The third lens 44 focuses the collimated light reflected by the optical filter 41 and outputs the focused beam to the photodiode 21 of the optical-receiving module 20. The beam is photoelectrically transformed by the photodiode 21 and voltage-amplified and output by the pre-amplifier 22, so that an optical signal is received.

At this time, the monitoring photodiode 12 of the optical-transmitting module 10 monitors the optical output of the laser diode 11 in real time and outputs an optical monitoring signal to an external driving circuit (not shown), and the external driving circuit controls input current of the laser diode 11 according to the optical output monitoring signal from the photodiode 12, thus maintaining the optical output of the laser diode 11 at a constant level.

The TO-can type bidirectional optical transceiver receives a current signal modulated according to a direct modulation method from the external driving circuit and performs on/off operations according to the received current signal. At this time, since the driving current of the driving circuit is transmitted to the laser diode 11 through transmission lines of a Printed Circuit Board (PCB) on which electronic devices of the optical-transmitting module 10 are mounted and through lead wires of the TO-can type bidirectional optical transceiver, the current transfer path may reach 10 mm or more in consideration of areas for soldering.

Accordingly, current leakage, electrical crosstalk and so on between peripheral transmission lines and electronic circuits occur, which makes high-speed modulation exceeding 10 Gbps difficult. Therefore, in order to achieve high-speed transmission and prevent current leakage and electrical crosstalk, the driving circuit has to be placed close to the laser diode 11 of the bidirectional optical transceiver.

However, the conventional TO-can type bidirectional optical transceiver has a cylindrical structure in which a housing including a laser diode therein cannot efficiently transfer internally generated heat to an external heat sink. Accordingly, the present inventor has performed research into a bidirectional optical transceiver with a stacked structure capable of preventing thermal and electrical crosstalk by improving heat dissipation characteristics.

SUMMARY

The following description relates to a bidirectional optical transceiver with a multi-layer structure which can prevent thermal, electrical or optical crosstalk.

The following description also relates to a bidirectional optical transceiver with a multi-layer structure which can achieve high-speed transmission through high-speed modulation by having installed therein a driving circuit for driving an optical-transmitting module.

The following description also relates to a bidirectional optical transceiver which has reduced packaging costs and manufacturing times, which makes mass production and miniaturization more effective, by implementing, as a stacked structure, an optical bench in which an optical system and an optical-transmitting module are installed and a multi-layer substrate in which an optical-receiving module and a driving circuit are installed.

According to an exemplary aspect, there is provided a bidirectional optical transceiver including: an optical system to transmit/receive a beam to/from an optical fiber; an optical bench having an accommodating part to mount the optical system thereon and on which an optical-transmitting module to emit a horizontal beam to the optical system is mounted; and a multi-layer substrate in which an optical-receiving module for receiving a vertical beam from the optical system and a driving circuit for driving the optical-transmitting module are installed on different layers and on which the optical bench is spaced mounted.

The bidirectional optical transceiver further includes a heat absorption unit positioned below the multi-layer substrate, to absorb heat generated by the optical-transmitting module or by the driving circuit.

The bidirectional optical transceiver further includes a heat dissipation via positioned between the optical-transmitting module and the heat absorption unit or between the driving circuit and the heat absorption unit, to transfer heat generated by the optical-transmitting module or by the driving circuit to the heat absorption unit.

The multi-layer substrate includes a plurality of insulation spaces to receive the optical-receiving module and the driving circuit separately therein in order to thermally isolate the optical-receiving module from the driving circuit.

Meanwhile, in the bidirectional optical transceiver, by constructing the optical filter through a combination of an edge filter and a band-pass filter, it is possible to prevent optical crosstalk between the optical-transmitting module and optical reception module.

Accordingly, by implementing, as a stacked structure, an optical bench in which an optical system and an optical-transmitting module are installed and a multi-layer substrate in which an optical-receiving module and a driving circuit for driving the optical-transmitting module are installed, it is possible to prevent thermal, electrical or optical crosstalk.

Also, by packaging the driving circuit for driving the optical-transmitting module inside the bidirectional optical transceiver, high-speed modulation and high-speed transmission are achieved.

Furthermore, by implementing, as the stacked structure, the optical bench in which the optical system and the optical-transmitting module are installed and the multi-layer substrate in which the optical-receiving module and the driving circuit are installed, packaging costs and manufacturing times can be reduced, which makes mass production and miniaturization more effective.

Other objects, features and advantages will be apparent from the following description, the drawings, and the claims.

BRIEF DESCRIPTION OF THE DRAWINGS

Elements, features, and structures are denoted by the same reference numerals throughout the drawings and the detailed description, and the size and proportions of some elements may be exaggerated in the drawings for clarity and convenience.

DETAILED DESCRIPTION

The detailed description is provided to assist the reader in gaining a comprehensive understanding of the methods, apparatuses and/or systems described herein. Various changes, modifications, and equivalents of the systems, apparatuses, and/or methods described herein will likely suggest themselves to those of ordinary skill in the art. Also, descriptions of well-known functions and constructions are omitted to increase clarity and conciseness.

Figure 1:
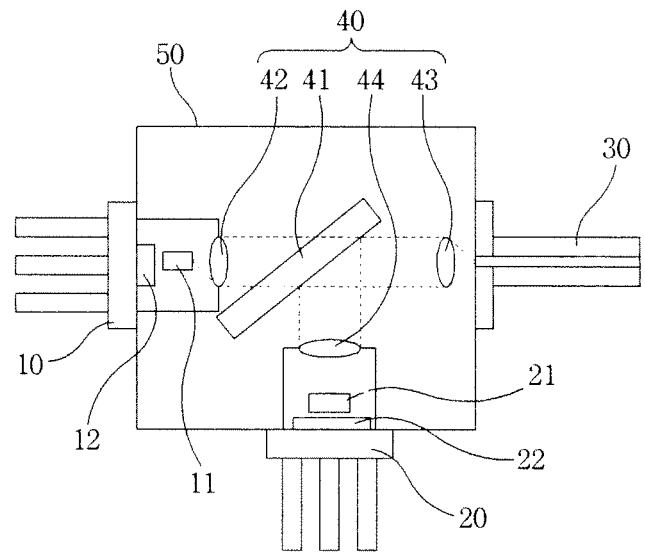
FIG. 1 illustrates a conventional TO-can type bidirectional optical transceiver.
Figure 2:
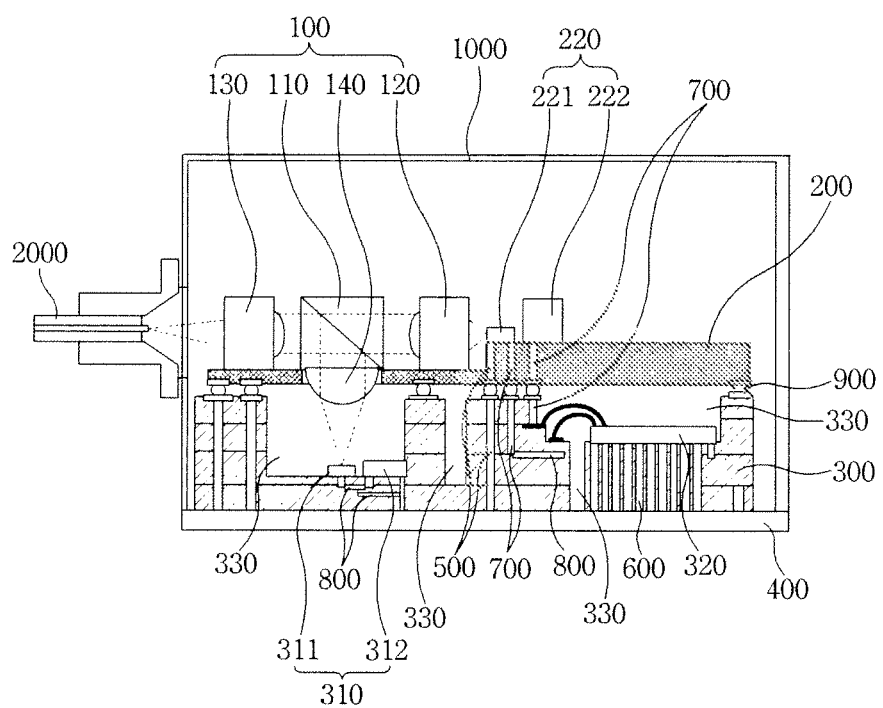
FIG. 2 is a cross-sectional view illustrating a bidirectional optical transceiver according to an exemplary embodiment.
Figure 3:
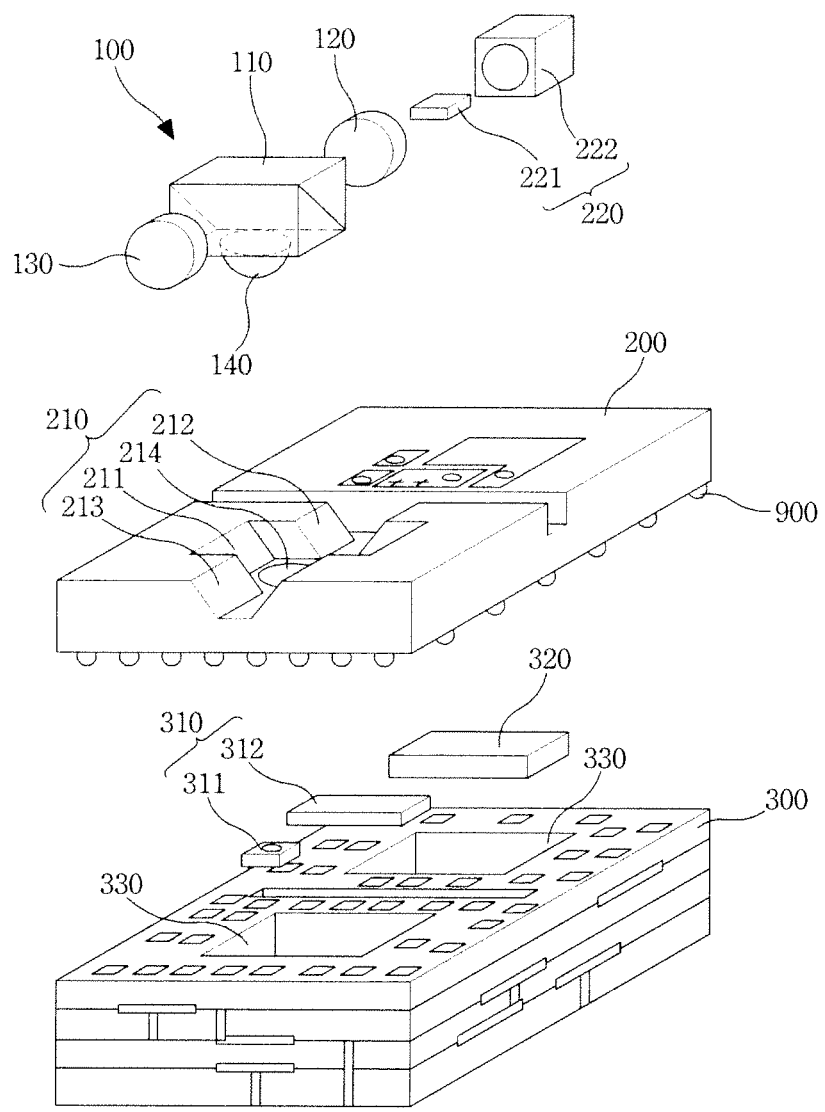
FIG. 3 is an exploded perspective view showing a stacked structure of the bidirectional optical transceiver.

FIG. 2 is a cross-sectional view illustrating a bidirectional optical transceiver according to an exemplary embodiment, and FIG. 3 is an exploded perspective view showing a stacked structure of the bidirectional optical transceiver. As illustrated in FIGS. 2 and 3, the bidirectional optical transceiver includes an optical system 100, an optical bench 200 and a multi-layer substrate 300.

The optical system 100 transmits an optical beam to an optical line or receives an optical beam from the optical line. An accommodating part 210 for mounting the optical system 100 thereon is formed in the optical bench 200 and an optical-transmitting module 220 for outputting a horizontal optical beam to the optical system 100 is mounted on the optical bench 200.

In the multi-layer substrate 300, an optical-receiving module 310 for receiving a vertical optical beam from the optical system 100 and a driving circuit 320 for driving the optical-transmitting module 220 are installed on different layers, and the optical bench 200 is spaced over the multi-layer substrate 300.

The optical-receiving module 310 and the driving circuit 320 are installed on different layers because the driving circuit 320 has to be positioned close to the optical-transmitting module 220 in order to make high-speed transmission possible, and the optical-receiving module 310 has to be spaced a predetermined distance from the optical system 100 in order to ensure focal distances of a beam output from the optical system 100.

For example, the optical-transmitting module 220 includes a laser diode 221 for outputting a transmission beam, and a monitoring photo diode 222 for monitoring the optical output of the laser diode 221 in real time to thus output an optical output monitoring signal to the driving circuit 320.

For example, the optical-receiving module 310 includes a photodiode 311 for photoelectrically transforming a vertical beam output from the optical system 100 and a preamplifier for voltage-amplifying signals photoelectrically transformed by the photodiode 311.

A beam transmitted from the laser diode 221 of the optical-transmitting module 220 is transmitted by the optical system 100 and directed towards the optical line, and then the beam is penetrated through the optical line as an optical signal and externally emitted.

Meanwhile, a beam received through the optical line is reflected by the optical system 100 and directed towards the photodiode 311 of the optical-receiving module 310, and then the beam is photoelectrically transformed by the photodiode 311 and voltage-amplified by the preamplifier 312, so that the resultant beam is received as optical signals.

At this time, the monitoring photodiode 222 of the optical-transmitting module 220 monitors the optical output of the laser diode 221 in real time and outputs the result of the monitoring as an optical output monitoring signal to the driving circuit 320. The driving circuit 320 controls input current of the laser diode 221 according to the optical output monitoring signal, thus maintaining the optical output of the laser diode 221 at a constant level.

As illustrated in FIG. 2, the bidirectional optical transceiver includes the driving circuit 320 for driving the optical-transmitting module 220, wherein the optical-transmitting module 220 is mounted on the optical bench 200 and the driving circuit 320 is mounted on the multi-layer substrate 300.

In this way, since the optical-transmitting module 220 which is vulnerable to a local rise in temperature and the driving circuit 320 having high consumption power are separated to be disposed on different layers, it is possible to prevent thermal or electric crosstalk that may occur due to a close disposition of the optical-transmitting module 220 to the driving circuit 320.

For example, the optical bench 200 may be made of silicon having excellent thermal diffusivity and the multi-layer substrate 300 may be formed as a stacked structure of a plurality of substrates each made of Low Temperature Co-fired Ceramic (LTCC) having high resistance. In this case, the excellent thermal diffusivity of the optical bench 200 helps heat dissipation of the optical-transmitting module 220 which is vulnerable to a local rise in temperature, and the high resistance of the multi-layer substrate 300 more efficiently prevents electrical crosstalk as the driving circuit 320 has high consumption power. Such thermal or electrical crosstalk affects the optical output of the optical-transmitting module 220, such as changing the wavelength of the optical output, thus deteriorating the quality of signal.

Meanwhile, current leakage through lead wires delays charging and discharging on transmission lines, which lowers modulation speed and thus deteriorates transmission speed. However, since the bidirectional optical transceiver according to the current embodiment includes therein the driving circuit 320 for driving the optical transmission module 220, the lengths of lead wires may be minimized, thus shortening the total length of transmission lines, and accordingly current leakage through the lead wires is reduced, which allows to high-speed modulation and high-speed transmission.

Also, in the bidirectional optical transceiver, since the optical bench 200 in which the optical system 100 and the optical-transmitting module 220 are installed and the multi-layer substrate 300 in which the optical-receiving module 310 and the driving circuit 320 are installed are implemented as a stacked structure, packaging costs and manufacturing times may be reduced compared to a 'non-stacked' structure, that is, planar arrangement, which further makes mass production more cost effective. Also, such a stacked structure allows the forming of a three-dimensional package and contributes to achieve high integration for miniaturization.

Meanwhile, according to another exemplary embodiment, the bidirectional optical transceiver further includes a heat absorption unit 400. The heat absorption unit 400 is positioned below the multi-layer substrate 300, and absorbs heat generated by the optical-transmitting module 220 or the driving circuit 320.

That is, according to the current embodiment, by causing the heat absorbing unit 400 to absorb heat generated inside the bidirectional optical transceiver for efficient heat dissipation, thermal or electric crosstalk which deteriorates optical output characteristics and wavelength stability may be further prevented.

Meanwhile, according to another exemplary embodiment, the bidirectional optical transceiver further includes a first heat dissipation via 500. The first heat dissipation via 500 is positioned between the optical-transmitting module 220 and the heat absorption unit 400 and transfers heat generated by the optical-transmitting module 220 to the heat absorption unit 400.

That is, according to the current embodiment, by disposing the first heat dissipation via 500 between the optical-transmitting module 220 and the heat absorption unit 400 to quickly transfer heat generated by the optical-transmitting module 220 to the heat absorption unit 400 through the first heat dissipation via 500 and thus externally dissipate the heat, more efficient heat dissipation may be achieved. Furthermore, since the first heat dissipation via 500 is positioned to be bored through the multi-layer substrate 300, heat transfer efficiency becomes more significant.

Meanwhile, according to another exemplary embodiment, the bidirectional optical transceiver further includes a second heat dissipation via 600. The second heat dissipation via 600 is positioned between the driving circuit 320 and the heat absorption unit 400 and transfers heat generated by the driving circuit 320 to the heat absorption unit 400.

That is, according to the current embodiment, by disposing the second heat dissipation via 600 between the driving circuit 320 and the heat absorption unit 400 to transfer heat generated by the driving circuit 320 to the heat absorption unit 400 and thus externally dissipate the heat through the heat absorption unit 400, more efficient heat dissipation may be achieved. Furthermore, since the second heat dissipation via 600 is positioned to be bored through the multi-layer substrate 300, heat transfer efficiency becomes more significant.

Meanwhile, according to another exemplary embodiment, the bidirectional optical transceiver further includes a signal transfer via 700. Thus, improved signal transmission can be performed through the signal transfer via 700 positioned between the optical-transmitting module 220 and the driving circuit 320.

That is, according to the current embodiment, by forming the signal transfer via 700 to be bored through the optical bench 200 and multi-layer substrate 300 separated from each other in order to prevent thermal or electric crosstalk due to a close disposition of the optical-transmitting module 220 to the driving circuit 320, and performing signal transmission between the optical-transmitting module 220 and the driving circuit 320 through the signal transfer via 700, the length of lead wires is minimized to reduce current leakage through the lead wires, high-speed modulation of transmission signals becomes possible, and in addition excellent insulation properties are achieved since the signal transfer via 700 is bored through the multi-layer substrate 300.

Meanwhile, according to another exemplary embodiment, the multi-layer substrate 300 includes a plurality of insulation spaces 330 to accommodate the optical-receiving module 310 and the driving circuit 320 separately therein and to thermally isolate the optical-receiving module 310 from the driving circuit 320.

That is, according to the current embodiment, by forming a plurality of insulation spaces 330 thermally isolated from each other in the multi-layer substrate 300 and installing the optical-receiving module 310 and the driving circuit 320 respectively in the insulation spaces 330, heat generated by the driving circuit 320 is efficiently blocked to minimize heat transfer to the optical-transmitting module 220 or optical-receiving module 310 and thus further improve heat blocking efficiency.

Also, since the optical-receiving module 310, driving circuit 320 and optical-receiving module 220 are electrically isolated by the insulation spaces 330 due to thermal, electrical and high-resistance characteristics of the multi-layer substrate 300, it is possible to reduce noise in the optical-receiving module 310 caused by crosstalk formed due to on/off signals from the driving circuit 320.

Meanwhile, according to another exemplary embodiment, the bidirectional optical transceiver may further include a passive element 800 which is positioned between layers of the multi-layer substrate 300, for impedance matching or noise filtering between the optical-transmitting module 220 or the optical-receiving module 310 and the driving circuit 320. Here, the passive element 800 may be appropriately selected in consideration of the thicknesses, widths and permittivity of transmission lines formed on the multi-layer substrate 300, the pattern widths and intervals of each layer and so on.

That is, according to the current embodiment, by installing a passive element 800, such as a resistor, a capacitor, an inductor, etc., between the layers of the multi-layer substrate 300 for impedance matching or noise filtering, an area size occupied by such a passive element may be reduced compared to a conventional 'non-stacked' structure, that is, planar arrangement, and a manufacturing process thereof may be simplified.

Meanwhile, according to another exemplary embodiment, the optical system 100 may include an optical filter 110, a first lens 120, a second lens 130 and a third lens 140.

The optical filter 110 penetrates collimated light to be transmitted and reflects collimated light to be received in a perpendicular direction.

The first lens 120 converts a horizontal beam output from the optical-transmitting module 220 into collimated light and transfers the collimated light to the optical filter 110.

The second lens 130 converts a beam received from an optical line into collimated light and transfers the collimated light to the optical filter 110, and focuses the collimated light transmitted by the optical filter 110 and transfers the focused beam to the optical line.

The third lens 140 focuses the collimated light reflected by the optical filter 110 and outputs the focused light as a vertical beam to the optical-receiving module 310.

A beam transmitted from the laser diode 221 of the optical-transmitting module 220 is transformed into collimated light by the first lens 120 of the optical system 100, is then input to the optical filter 110, is penetrated by the optical filter 110 and is then directed towards the second lens 130. The second lens 130 focuses the collimated light penetrated by the optical filter 110 and directs the focused beam towards the optical line. The beam is externally transmitted through the optical line, so that an optical signal is transmitted.

Meanwhile, a beam received through the optical line is transformed into collimated light by the second lens 130 and then input to the optical filter 110, and reflected in a perpendicular direction by the optical filter 110 and then output to the third lens 140. The third lens 140 focuses the collimated light reflected by the optical filter 110 and outputs the focused beam to the photodiode 311 of the optical-receiving module 310. The beam is photoelectrically transformed by the photodiode 311, voltage-amplified by the pre-amplifier 312 and then output, so that an optical signal is received.

Figure 4:
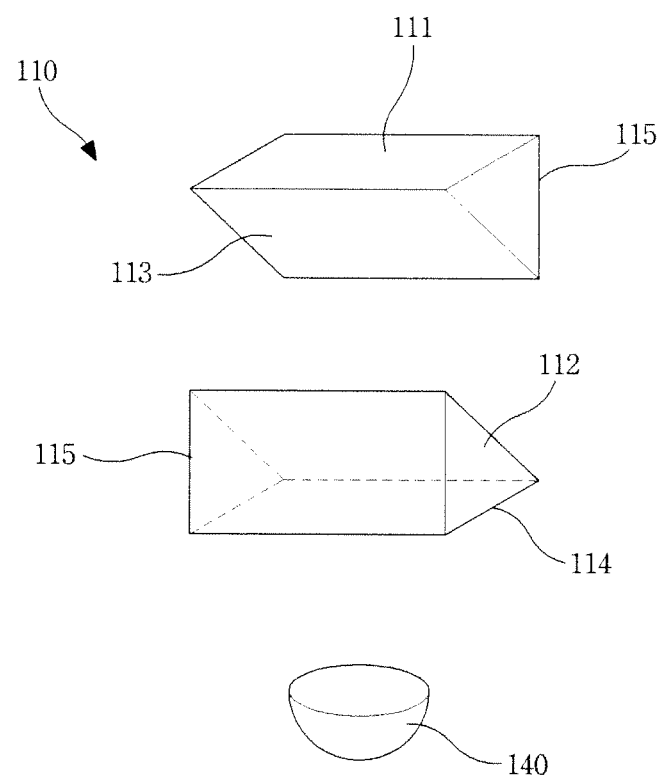
FIG. 4 is an exploded perspective view showing a configuration of an optical system included in the bidirectional optical transceiver.

Meanwhile, according to another exemplary embodiment, the optical filter 110 of the optical system 100, as illustrated in FIG. 4, may include first and second prisms 111 and 112 whose inclined surfaces face each other, an edge filter 113 and a bandpass filter 114. FIG. 4 is an exploded perspective view showing the configuration of the optical system 100 included in the bidirectional optical transceiver.

The edge filter 113 is formed on the inclined surface of the first prism 111, facing the second prism 112. The edge filter 113 penetrates collimated light received from the first lens 120 and reflects collimated light received from the second lens 130 in a perpendicular direction, thereby changing the path of the light.

The bandpass filter 114 is formed on a surface of the second prism 112, facing the third lens 140. The bandpass filter 114 penetrates only a specific wavelength range of light among the collimated light reflected in the perpendicular direction by the edge filter 113, thereby removing optical noise from the light.

That is, according to the current embodiment, by placing the edge filter 113 on the inclined surface of the first prism 111 facing the second prism 112 of the optical filter 110 to change paths of transmission light and reception light through the edge filter 113, and placing the bandpass filter 114 on the surface of the second prism 112 facing the third lens 140 to selectively transmit only a specific wavelength range of light through the bandpass filter 114 and thus removing noise, optical crosstalk of the optical-transmitting module 220 and optical-receiving module 310 may be prevented.

Meanwhile, according to another exemplary embodiment, the optical filter 110 of the optical system 100 may further include an anti-reflective coating layer 115. The anti-reflective coating layer 115 is formed on the surface of the first prism 111 facing the first lens 120 or on the surface of the second prism 112 facing the second lens 130, in order to minimize reflection of light.

That is, according to the current embodiment, by forming the anti-reflective coating layer 115 on the surface of the first prism 111 facing the first lens 120 or on the surface of the second prism 112 facing the second lens 130 to prevent transmission light or reception light from being reflected, optical crosstalk is minimized.

Meanwhile, according to another exemplary embodiment, the accommodating part 210 of the optical bench 200 may have a first accommodating portion 211 which receives and fixes the optical filter 110, a second accommodating portion 212 which receives and fixes the first lens 120, a third accommodating portion 213 which receives and fixes the second lens 130 and an insertion opening 214 through which the third lens 140 is inserted.

That is, according to the current embodiment, by fixedly arranging the optical filter 110, first lens 120, second lens 130 and third lens 140, which form the optical system 100, respectively, in the first accommodating portion 211, second accommodating portion 212, third accommodating portion 213 and insertion opening 214 formed in the accommodating part 210 of the optical bench 200 so that the optical filter 110, first lens 120, second lens 130 and third lens 140 do not move relative to each other, a highly-accurate optical axis alignment is achieved.

Meanwhile, according to another exemplary embodiment, the bidirectional optical transceiver may further include a plurality of solder balls 900 which are soldered between the optical bench 200 and the multi-layer substrate 300, to separate the optical bench 200 from the multi-layer substrate 300.

Accordingly, due to the solder balls 900, the optical bench 200 is thermally isolated from the multi-layer substrate 300, thus preventing thermal crosstalk therebetween. Also, the solder balls 900 act as lead wires to electrically connect the optical-transmitting module 220 mounted on the optical bench 200 to the driving circuit 320 installed in the multi-layer substrate 300.

As described above, in the bidirectional optical transceiver according to the current embodiment, by implementing, as a stacked structure, the optical bench 200 in which the optical system 100 and the optical-transmitting module 220 are installed and the multi-layer substrate 300 in which the optical-receiving module 310 and the driving circuit 320 are installed, while packaging the driving circuit 320 for driving the optical-transmitting module 220 inside the multi-layer substrate 300, thermal, electrical or optical crosstalk are prevented, high-speed signal transmission becomes possible through high-speed modulation and miniaturization can be implemented.

Meanwhile, the bidirectional optical transceiver is packaged by the housing 1000 to form a sealed environment. A reference number 2000 of FIG. 2 denotes an optical line such as an optical fiber and the term 'crosstalk' mentioned in the whole specification means the phenomenon in which thermal, electrical or optical interference occurs between two or more adjacent signals.

It will be apparent to those of ordinary skill in the art that various modifications can be made to the exemplary embodiments of the invention described above. However, as long as modifications fall within the scope of the appended claims and their equivalents, they should not be misconstrued as a departure from the scope of the invention itself.

What is claimed is:

1. A bidirectional optical transceiver comprising:
   an optical system to transmit/receive a beam to/from an optical fiber;
   an optical bench having an accommodating part to mount the optical system thereon and on which an optical-transmitting module to emit a horizontal beam to the optical system is mounted; and
   a multi-layer substrate in which an optical-receiving module for receiving a vertical beam from the optical system and a driving circuit for driving the optical-transmitting module are installed on different vertical layers and on which the optical bench is spaced mounted,
   wherein:
   the multi-layer substrate comprises an insulating space to electrically and optically isolate the optical-receiving module from the optical-transmitting module,
   the optical-receiving module is accommodated in the insulating space of the multi-layer substrate,
   the insulating space is closed by covering an upper portion of the insulating space having the optical-receiving module accommodated therein with the optical bench,
   the optical-transmitting module is installed on the optical bench which is isolated from the optical-receiving module accommodated in the insulating space, and
   the optical system changes a direction of a path of light of the received beam to a perpendicular direction and the received beam is focused on the optical-receiving module.

2. The bidirectional optical transceiver of claim 1, further comprising a heat absorption unit positioned below the multi-layer substrate, to absorb heat generated by the optical-transmitting module or by the driving circuit.

3. The bidirectional optical transceiver of claim 2, further comprising a first heat dissipation via positioned between the optical-transmitting module and the heat absorption unit, to transfer the heat generated by the optical-transmitting module to the heat absorption unit.

4. The bidirectional optical transceiver of claim 2, further comprising a second heat dissipation via positioned between the driving circuit and the heat absorption unit, to transfer the heat generated by the driving circuit to the heat absorption unit.

5. The bidirectional optical transceiver of claim 1, further comprising a signal transmission via positioned between the optical-transmitting module and the driving circuit, to transmit signals.

6. The bidirectional optical transceiver of claim 1, wherein the multi-layer substrate includes a plurality of insulation spaces to receive the optical-receiving module and the driving circuit separately therein in order to thermally isolate the optical-receiving module from the driving circuit.

7. The bidirectional optical transceiver of claim 1, further comprising a passive element installed between layers of the multi-layer substrate, to perform impedance matching or noise filtering between the optical-transmitting module or the optical-receiving module and the driving circuit.

8. The bidirectional optical transceiver of claim 1, wherein the optical system comprises:
   an optical filter to penetrate collimated light to be transmitted and reflect collimated light to be received in a perpendicular direction;
   a first lens to convert the horizontal beam emitted from the optical-transmitting module into collimated light and transfer the collimated light to the optical filter;
   a second lens to convert the beam received from the optical fiber into a collimated beam and transfer the collimated beam to the optical filter, and to focus the collimated light transmitted by the optical filter and output the focused light as a beam to the optical fiber; and
   a third lens to focus the collimated light reflected by the optical filter and output the focused light as a vertical beam to the optical-receiving module.

9. The bidirectional optical transceiver of claim 8, wherein the optical filter comprises:
   a first prism and a second prism whose inclined surfaces face each other;
   an edge filter formed on the inclined surface of the first prism facing the second prism, to penetrate collimated light received from the first lens and reflect collimated light received from the second lens in a perpendicular direction, to change the path of light; and
   a band-pass filter formed on a surface of the second prism facing the third lens, to penetrate only a specific wavelength range of light among the collimated light reflected in the perpendicular direction by the edge filter, to remove optical noise from the collimated light.

10. The bidirectional optical transceiver of claim 9, wherein the optical filter further comprises an anti-reflective coating layer formed on a surface of the first prism facing the first lens or on a surface of the second prism facing the second lens, to minimize reflection of light.

* * * * *